United States Patent
Conley et al.

(10) Patent No.: US 7,447,066 B2
(45) Date of Patent: Nov. 4, 2008

(54) MEMORY WITH RETARGETABLE MEMORY CELL REDUNDANCY

(75) Inventors: Kevin M. Conley, San Jose, CA (US); Yoram Cedar, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 108 days.

(21) Appl. No.: 11/270,410

(22) Filed: Nov. 8, 2005

(65) Prior Publication Data
US 2007/0103978 A1    May 10, 2007

(51) Int. Cl.
G11C 11/34 (2006.01)
G11C 7/00 (2006.01)
(52) U.S. Cl. .............. 365/185.03; 365/185.11; 365/185.17; 365/185.33; 365/185.09; 365/200; 365/225.7
(58) Field of Classification Search .......... 365/185.03, 365/185.09, 185.17, 185.33, 200, 225.7, 365/185.11
See application file for complete search history.

(56) References Cited

U.S. PATENT DOCUMENTS

| | | | |
|---|---|---|---|
| 3,895,360 A | 7/1975 | Cricchi et al. | |
| 4,720,815 A | 1/1988 | Ogawa | |
| 4,757,477 A | 7/1988 | Nagayama et al. | |
| 5,043,940 A | 8/1991 | Harari | 365/168 |
| 5,070,032 A | 12/1991 | Yuan et al. | 437/43 |
| 5,095,344 A | 3/1992 | Harari | |
| 5,172,338 A | 12/1992 | Mehrotra et al. | |
| 5,200,959 A | 4/1993 | Gross et al. | |
| 5,270,979 A | 12/1993 | Harari et al. | |
| 5,313,421 A | 5/1994 | Guterman et al. | 368/185 |
| 5,315,541 A | 5/1994 | Harari et al. | |
| 5,343,063 A | 8/1994 | Yuan et al. | 257/317 |
| 5,380,672 A | 1/1995 | Yuan et al. | |
| 5,386,390 A | 1/1995 | Okitaka | |
| 5,428,621 A | 6/1995 | Mehrotra et al. | |
| 5,430,679 A | 7/1995 | Hiltebeitel et al. | |
| 5,430,859 A | 7/1995 | Norman et al. | |
| 5,438,573 A | 8/1995 | Mangan et al. | |
| 5,442,748 A | 8/1995 | Chang et al. | |
| 5,479,370 A | 12/1995 | Furuyama et al. | |
| 5,485,425 A * | 1/1996 | Iwai et al. | 365/200 |
| 5,532,962 A | 7/1996 | Auclair et al. | 365/201 |

(Continued)

FOREIGN PATENT DOCUMENTS

EP    0 797 145 A1    9/1997

(Continued)

OTHER PUBLICATIONS

USPTO, Office Action mailed in related U.S. Appl. No. 11/270,198 on Jul. 25, 2007, 9 pages.

(Continued)

*Primary Examiner*—Trong Phan
(74) *Attorney, Agent, or Firm*—Winston & Strawn LLP

(57) ABSTRACT

In a memory array having redundant columns, a scheme allows defective cells to be individually remapped to redundant cells in a redundant column. Redundant cells in one redundant column replace defective cells in multiple non-redundant columns. Remapping is done as part of initial test and configuration. Specific hardware can be used for the scheme or firmware in the memory controller can implement the scheme.

16 Claims, 6 Drawing Sheets

U.S. PATENT DOCUMENTS

| | | | |
|---|---|---|---|
| 5,535,328 | A | 7/1996 | Harari et al. |
| 5,570,315 | A | 10/1996 | Tanaka et al. ......... 365/185.22 |
| 5,602,987 | A | 2/1997 | Harari et al. |
| 5,642,312 | A | 6/1997 | Harari |
| 5,657,332 | A | 8/1997 | Auclair et al. |
| 5,661,053 | A | 8/1997 | Yuan ........................... 437/43 |
| 5,663,901 | A | 9/1997 | Wallace et al. |
| 5,682,352 | A | 10/1997 | Wong et al. |
| 5,712,180 | A | 1/1998 | Guterman et al. |
| 5,774,397 | A | 6/1998 | Endoh et al. ........... 365/185.19 |
| 5,783,958 | A | 7/1998 | Lysinger |
| 5,798,968 | A | 8/1998 | Lee et al. ............... 365/185.29 |
| 5,808,945 | A * | 9/1998 | Arase ........................ 365/200 |
| 5,848,009 | A * | 12/1998 | Lee et al. .................... 365/200 |
| 5,862,080 | A * | 1/1999 | Harari et al. ........... 365/185.33 |
| 5,890,192 | A | 3/1999 | Lee et al. |
| 5,909,449 | A | 6/1999 | So et al. .................... 371/21.4 |
| 5,930,167 | A | 7/1999 | Lee et al. ............... 365/185.03 |
| 6,038,184 | A | 3/2000 | Naritake |
| 6,046,935 | A | 4/2000 | Takeuchi et al. ....... 365/185.03 |
| 6,091,666 | A | 7/2000 | Arase et al. |
| 6,141,267 | A | 10/2000 | Kirihata et al. |
| 6,151,248 | A | 11/2000 | Harari et al. |
| 6,222,762 | B1 | 4/2001 | Guterman et al. |
| 6,230,233 | B1 | 5/2001 | Lofgren et al. |
| 6,243,306 | B1 | 6/2001 | Kirihata |
| 6,252,800 | B1 | 6/2001 | Chida |
| 6,426,893 | B1 | 7/2002 | Conley et al. |
| 6,456,528 | B1 | 9/2002 | Chen ..................... 365/185.03 |
| 6,480,423 | B2 | 11/2002 | Toda et al. |
| 6,484,277 | B1 | 11/2002 | Schönemann ............... 714/710 |
| 6,512,263 | B1 | 1/2003 | Yuan et al. |
| 6,522,580 | B2 | 2/2003 | Chen et al. |
| 6,560,146 | B2 | 5/2003 | Cernea |
| 6,563,732 | B2 | 5/2003 | Matarrese et al. |
| 6,594,177 | B2 * | 7/2003 | Matarrese et al. ...... 365/185.09 |
| 6,621,749 | B2 * | 9/2003 | Lee ............................ 365/200 |
| 6,671,214 | B2 | 12/2003 | Abedifard et al. |
| 6,707,733 | B2 | 3/2004 | Taura et al. |
| 6,763,424 | B2 | 7/2004 | Conley ....................... 711/103 |
| 6,771,536 | B2 | 8/2004 | Li et al. |
| 6,813,184 | B2 | 11/2004 | Lee |
| 6,834,016 | B2 | 12/2004 | Kato et al. |
| 6,853,596 | B2 * | 2/2005 | Cheung ...................... 365/200 |
| 6,990,018 | B2 * | 1/2006 | Tanaka et al. .......... 365/185.09 |
| 7,027,330 | B2 * | 4/2006 | Park ...................... 365/185.09 |
| 7,057,939 | B2 * | 6/2006 | Li et al. .................. 365/185.03 |
| 7,079,419 | B2 * | 7/2006 | Roohparvar ............ 365/185.17 |
| 7,110,294 | B2 * | 9/2006 | Kawai .................... 365/185.09 |
| 7,116,590 | B2 * | 10/2006 | Blodgett ..................... 365/200 |
| 2003/0016182 | A1 | 1/2003 | Lohr |
| 2003/0109093 | A1 | 6/2003 | Harari et al. ................ 438/200 |
| 2003/0223274 | A1 | 12/2003 | Cernea |
| 2004/0057288 | A1 | 3/2004 | Cernea |
| 2004/0060031 | A1 | 3/2004 | Cernea |
| 2004/0109357 | A1 | 6/2004 | Cernea et al. |
| 2005/0141387 | A1 | 6/2005 | Cernea et al. ............... 369/100 |
| 2007/0103977 | A1 | 5/2007 | Conley et al. .......... 365/185.09 |

FOREIGN PATENT DOCUMENTS

| | | |
|---|---|---|
| JP | 01128297 | 5/1989 |
| WO | 03/025939 A2 | 3/2003 |
| WO | WO 2007/056651 A1 | 5/2007 |

OTHER PUBLICATIONS

USPTO, "Notice of Allowance" mailed in related U.S. Patent Appl. No. 11/270,198 (publication No. 2007/0103977A1) on Dec. 14, 2007, 11 pages.

USPTO, "Supplemental Notice of Allowability" mailed in related U.S. Patent Appl. No. 11/270,198 (publication No. 2007/0103977A1) on Feb. 11, 2008, 8 pages.

EP - International Searching Authority, "Notification of Transmittal of the International Search Report and Written Opinion of the International Searching Authority, od the Declaration," mailed in corresponding Internation Application NO. PCT/US2006/060453 (publication No. WO 2007/056651A1) on Mar. 28, 2007, 9 pages.

USPTO, "Notice of Allowance" mailed in related U.S. Patent Appl. No. 11/270,198 (publication No. 2007/0103977A1) on Mar.. 14, 2007, 7 pages.

USPTO, "Office Action" mailed in related U.S. Patent Appl. No. 11/270,198 (publication No. 2007/0103977A1) on Oct. 23, 2006, 11 pages.

* cited by examiner

MEMORY WITH RETARGETABLE MEMORY CELL REDUNDANCY

CROSS-REFERENCE TO RELATED APPLICATIONS

This application is related to U.S. patent application Ser. No. 11/270,198, entitled, "Retargetable Memory Cell Redundancy Methods," filed on the same day as the present application.

BACKGROUND

This invention relates to nonvolatile memories and in particular, the use of redundant data storage units in flash memories to replace defective data storage units.

There are many commercially successful non-volatile memory products being used today, particularly in the form of small form factor cards, which employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data. Some of the commercially available cards are CompactFlash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. Besides the memory card implementation, this type of memory can alternatively be embedded into various types of host systems.

Two general memory array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762. These patents, along with all other patents, patent applications and other publications cited in this application are hereby incorporated by reference in their entirety.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in U.S. patent application Publication No. 2003/0109093 of Harari et al.

As in most integrated circuit applications, the pressure to shrink the silicon substrate area required to implement some integrated circuit functions also exists with flash EEPROM memory arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, and for structures using dielectric floating gates in aforementioned U.S. patent application Publication No. 2003/0109093. Selected portions of a multi-state memory array may also be operated in two states (binary) for various reasons, in a manner described in U.S. Pat. Nos. 5,930,167 and 6,456,528.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with many pages in each block, and each page storing multiple host sectors of data.

In order to increase the degree of parallelism during programming user data into the memory array and read user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, blocks may be linked together to form virtual blocks or metablocks. That is, each metablock is defined to include one block from each plane. Use of the metablock is described in U.S. Pat. No. 6,763,424 which patent is hereby incorporated by reference in its entirety. The metablock is identified by a host logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory array. Individual pages within the blocks are typically identified by offsets within the block address. Address translation often involves use of intermediate terms of a logical block number (LBN) and logical page.

In some memory systems, the physical memory cells are also grouped into two or more zones. A zone may be any partitioned subset of the physical memory or memory system into which a specified range of logical block addresses is mapped. For example, a memory system capable of storing 64 Megabytes of data may be partitioned into four zones that store 16 Megabytes of data per zone. The range of logical block addresses is then also divided into four groups, one group being assigned to the physical blocks of each of the four zones. Logical block addresses are constrained, in a typical implementation, such that the data of each are never written outside of a single physical zone into which the logical block addresses are mapped. In a memory array divided into planes (sub-arrays), which each have their own addressing, programming and reading circuits, each zone preferably includes blocks from multiple planes, typically the same number of blocks from each of the planes. Zones are primarily used to simplify address management such as logical to physical translation, resulting in smaller translation tables, less RAM memory needed to hold these tables, and faster access times to address the currently active region of memory, but because of their restrictive nature can result in less than optimum wear leveling.

Individual flash EEPROM cells store an amount of charge in a charge storage element or unit that is representative of one or more bits of data. The charge level of a storage element controls the threshold voltage (commonly referenced as $V_T$) of its memory cell, which is used as a basis of reading the storage state of the cell. A threshold voltage window is commonly divided into a number of ranges, one for each of the two or more storage states of the memory cell. In this way, a cell can hold one bit of data or can hold two or more bits of data depending on the number of voltage ranges. These ranges are separated by guardbands that include a nominal sensing level that allows determining the storage states of the individual cells. These storage levels often shift as a result of charge disturbing programming, reading or erasing operations performed in neighboring or other related memory cells, pages or blocks. Error correcting codes (ECCs) are therefore typically calculated by the controller and stored along with the host data being programmed and used during reading to verify the data and perform some level of data correction if necessary. Also, shifting charge levels can be restored back to the centers of their state ranges from time-to-time, before disturbing operations cause them to shift completely out of their defined ranges and thus cause erroneous data to be read. This process, termed data refresh or scrub, is described in U.S. Pat. Nos. 5,532,962 and 5,909,449, which patents are hereby incorporated by reference in their entirety.

Memory cells in a memory array may sometimes be defective. Cells may be defective in a new memory chip because of a manufacturing defect or may become defective during use of the chip. Where a cell become defective during use, the defect may be detected by failure to erase, write to or read from the cell. One way to deal with such defects is to store data that would be stored in a defective portion of the memory at another location. Such remapping of data from a defective location to a replacement location is described in U.S. Pat. No. 5,535,328, entitled "Non-volatile memory system card with flash erasable sectors of EEPROM cells including a mechanism for substituting defective cells," which patent is hereby incorporated by reference in its entirety. The defective cell may be remapped to a different location or an entire sector may be remapped to another location. Another scheme for relocating data away from defective cells is described in U.S. Pat. No. 5,200,959, entitled "Device and method for defect handling in semi-conductor memory," which patent is hereby incorporated by reference in its entirety. The data of an entire block may also be relocated in this way when a defective cell is found in one block of the memory array.

Yet another scheme for managing defective cells is described in U.S. Pat. No. 5,438,573, entitled "Flash EEPROM array data and header file structure," which patent is hereby incorporated by reference in its entirety. This scheme relocates a bit of data corresponding to a defective memory cell to the next cell in the row. The bit corresponding to the next cell is relocated to its neighbor and so on, so that the bits in the row are pushed over by one bit. Redundant bits are provided in each row so that the data still fits in the row.

Defective cells may be detected in several ways either during a testing procedure, typically done at the factory prior to use of the memory chip by a user, or during normal use where defects are generally found by the memory controller. Factory testing generally finds physical defects resulting from manufacturing. Such testing uses dedicated test equipment that is connected to the memory system for testing but is disconnected after testing is complete. The defective area is remapped in a permanent manner. Defects may be found by attempting to program, read and erase portions of the memory array to see if any cells fail to perform within specified limits. Latent defects may also be detected as described in U.S. Pat. No. 5,428,621, entitled "Latent defect handling in EEPROM devices," which patent is hereby incorporated by reference in its entirety.

In some prior art designs, redundant columns of cells are provided to replace defective columns in the memory array. Such redundant columns do not store any data if there are no defects in the memory array. FIG. 1 shows an example of the use of redundant columns according to the prior art. During testing of a memory array, it is found that a memory cell is defective. The defect may be the result of contamination, misprocessing or some other cause. When defective cell 101 is encountered in column 1, column 1 is considered defective and is mapped to redundant column A. This mapping is recorded in some way so that column 1 is not used. Typically, the mapping is recorded by burning fuses that indicate the column that is defective. Any data that would have been sent to column 1 if it were not for the remapping is now sent to redundant column A. Defective cell 101 is replaced by replacement cell 103. In addition, all the other cells of column 1, which are not defective, are also replaced by cells in redundant column A.

FIG. 2 shows a simplified illustration of a memory system 200 for carrying out column replacement illustrated in FIG. 1.

During testing, a flash fuse is burned to indicate the location of a defective column. A flash fuse is a flash cell or group of cells that is treated as a fuse, but unlike conventional fuses may be reprogrammable. There may be one fuse for each non-redundant column of flash memory cell array 221. When memory system 200 starts up, flash fuses 220 are read into column redundancy control registers 222 so that the location of the defective column and its replacement are indicated by the contents of the registers. When the host sends a memory access command, the physical address to be accessed is compared with the column addresses in column redundancy control registers 222. If a defective column is indicated, then instead of trying to access the defective column, the replacement column is accessed. Thus, column redundancy control registers 222 provide a replacement column address to Y-address decode circuitry 224 so that the defective column is not accessed. More than one defective column may be replaced in this way. Typically, a number of replacement columns 226 are provided so that a number of columns may be replaced. FIG. 1 shows N+1 non-redundant columns (columns 0 to N) and four redundant columns (columns A to D). Word lines extend across the array at right angles to the columns, extending over both redundant and non-redundant columns.

A defective cell is not always a completely unusable cell, it may simply operate outside specified performance limits. For example, a cell that is not programmed after a certain number of voltage pulses may be considered defective even though it is capable of programming if additional pulses are provided. The performance limits that are chosen determine the number of defective cells that are found. By setting high performance limits, overall performance may be improved (e.g. program time may be reduced) but the number of defects will increase. Setting low performance limits reduces the number of defects at the expense of performance.

While the prior art column replacement scheme of FIGS. 1 and 2 described above allows a memory array to be operated with one or more defective cells, it has several drawbacks. This scheme requires as many redundant columns as there are non-redundant columns with defective cells, generally one redundant column per defect. Redundant columns occupy valuable space on a chip and add to the cost of producing a chip. The more redundant columns are provided, the greater the cost. However, if too few redundant columns are provided, there may not be enough redundant columns to repair some chips so that the chip is unusable. Thus, yield may suffer if too few redundant columns are provided. Newer memory arrays have more memory cells and smaller feature sizes, which tend to increase the number of defects in a memory array. Also, as more cells are programmed together in large pages, programming time tends to be limited by a few slow cells if they are not replaced. Thus, replacement of defective cells is important for newer memory systems.

Therefore, there is a need for a more space efficient way of mapping defective cells. There is also a need for memory systems that include circuitry for more efficiently carrying out such mapping.

SUMMARY

A retargetable memory cell redundancy scheme allows individual mapping of defective cells to redundant cells in a redundant column instead of mapping entire columns to redundant columns when they contain defective cells. Defective cells in multiple columns may be mapped to the same redundant column in this way. An entire column is not necessarily considered defective just because one or more cells in the column are defective. This allows much more efficient use of the space available in the redundant column.

Detecting defective cells and mapping them to redundant cells in redundant columns takes place as part of an initial test and configuration operation before a memory system is used to store user data. The mapping is generally permanent so that any defective cells remain unused for the lifetime of the memory system. Defect mapping data records the locations of defective columns or cells in the memory array and is generated and stored during initial test and configuration. Defect mapping data may be stored in a portion of the flash memory or in a dedicated memory.

During normal operation of the memory system (after initial test and configuration), any attempt to access a defective cell is redirected and the replacement cell is accessed instead. Both column and row addresses must match those of a defective cell address for such redirection to occur, whereas only column addresses had to match in prior art schemes.

Both individual cell replacement and column replacement may be implemented in the same memory system at the same time. Generally, the column replacement is done first for any column in which all the memory cells are defective or more than a threshold number are defective. Subsequently, individual cells in remaining non-redundant columns may be mapped to redundant columns that were not needed for replacement of entire columns. Cells may also be replaced in intermediate sized groups of more than one cell, but less than an entire column. One example of such an intermediate sized group is the group formed by the memory cells in a NAND string that are connected together in series A cell replacement scheme may be implemented using circuits that are located adjacent to the memory array and are on the same chip as the memory array. Such circuits are similar to certain circuits of the prior art but contain additional circuitry to allow comparison of row addresses to the row addresses of defective cells that have been remapped. Alternatively, a cell replacement scheme may be implemented using the memory controller to compare addresses to be accessed with the addresses from the defect mapping data. Such a scheme may be implemented without hardware changes and requires only a change to the memory controller firmware.

Flash memories are block erasable so that cells are not erased individually, but in units of a block. Blocks generally extend across multiple columns. A block may extend across both redundant columns and non-redundant columns and defective cells within the block are mapped to redundant cells in the same block. Thus, the redundant cells and non-redundant cells containing logically sequential data are erased together.

DESCRIPTION OF EMBODIMENTS

Figure 1:
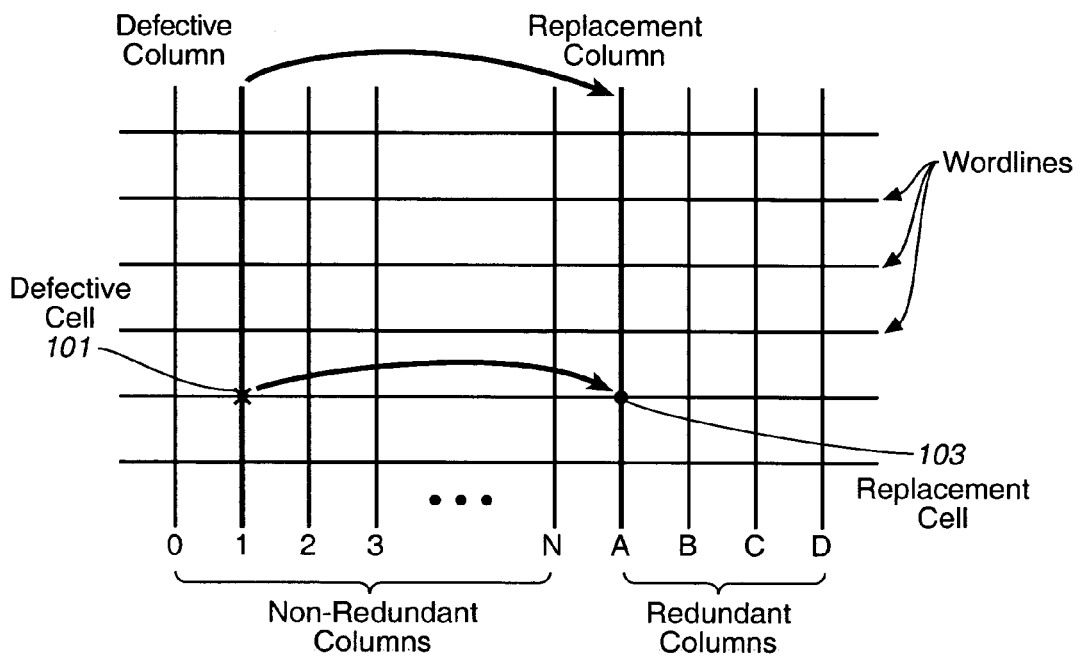
FIG. 1 shows a column replacement scheme of the prior art.
Figure 2:
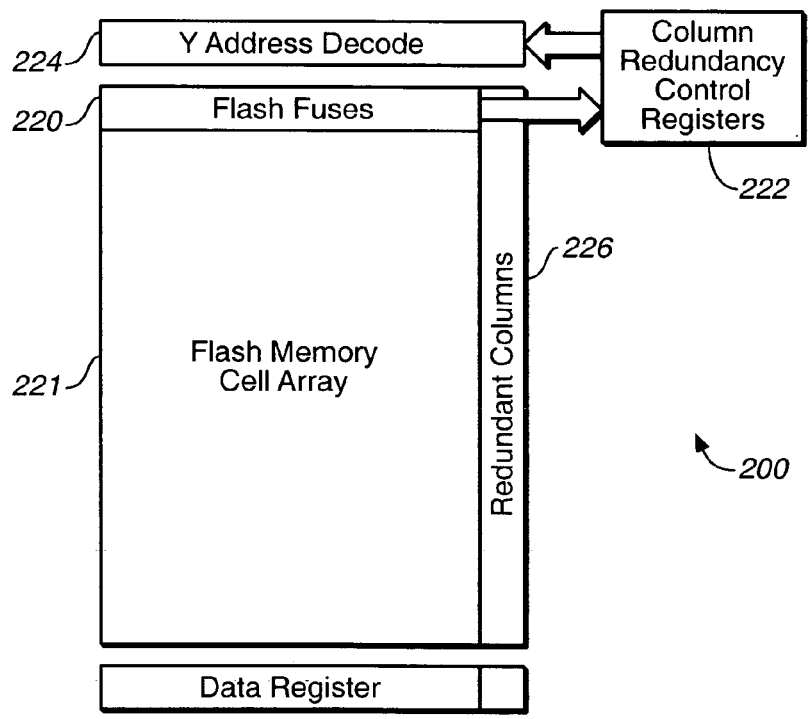
FIG. 2 shows a prior art memory array and peripheral circuitry for carrying out the column replacement scheme of FIG. 1.
Figure 3:
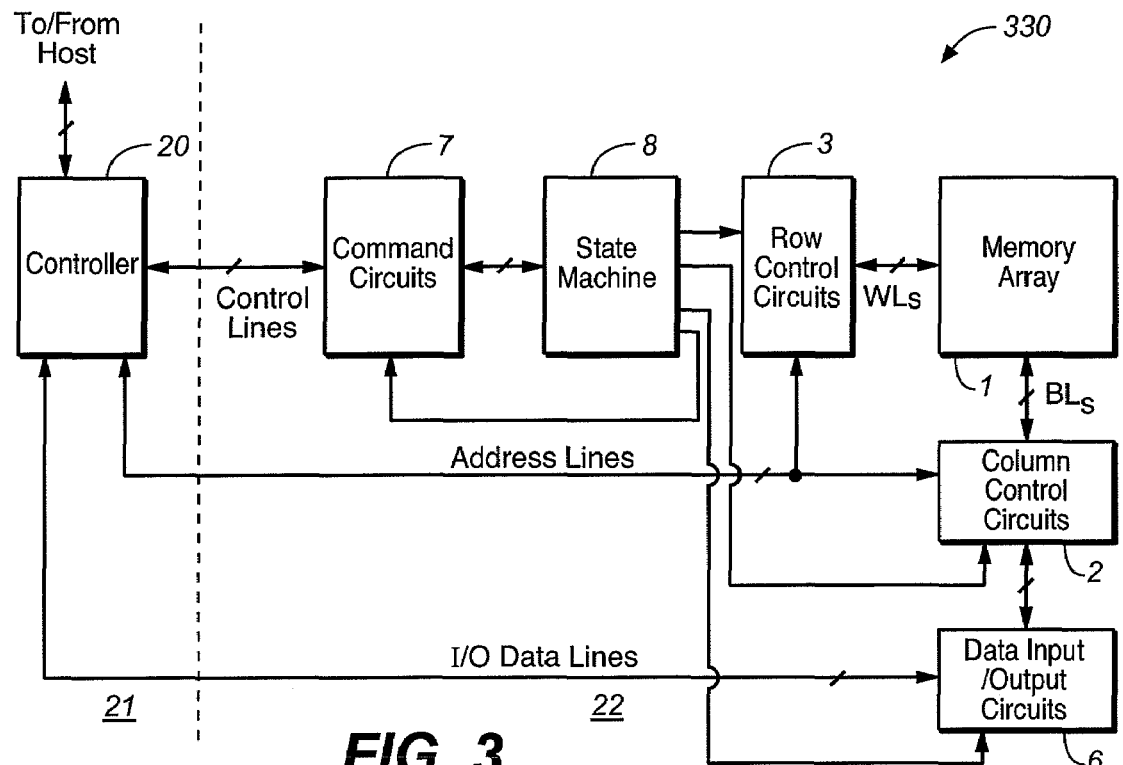
FIG. 3 shows a memory system supporting aspects of the present invention.

FIG. 3 shows a memory system 330 that includes aspects of the present invention. Memory system 330 is connected to a host (not shown) and is in communication with the host. Typically, this communication between host and memory system takes place through a standard interface. In some examples, a memory system such as memory system 330 is part of a removable memory card that has a standard interface so that it can be connected to a variety of hosts according to standards such as those previously listed. In an alternative arrangement, a memory system such as memory system 330 may be embedded in a host system so that it is permanently connected to the host system.

Memory system 330 includes a controller 20 that controls operation of memory array 1 in response to commands received from the host. Controller 20 may contain a microprocessor, RAM, flash, buffers, registers, Error Correction Code (ECC) circuits and other circuits to manage memory system 330. Data received from the host is stored in memory array 1 under the direction of controller 20 when a host write command is received. For example, the physical locations at which such data are written are generally determined by the controller. Controller 20 operates according to firmware that may be loaded into controller 20 during initial configuration. Data is read from memory array 1 under the direction of controller 20 when a read command is received from the host. Typically, controller 20 maintains a record of logical-to-physical mapping of host data so that when data are identified by the host by a logical address, the data may be accessed in the correct physical address in memory array 1.

Controller 20 communicates with memory array 1 through peripheral circuits between controller 20 and memory array 1. Peripheral circuits include row control circuits 3, column control circuits 2, data input/output circuits 6, a state machine 8 and command circuits 7. Additional peripheral circuits may also be used, but are not shown in FIG. 3 for clarity. When a particular command is sent from controller 20 to command circuits 7, state machine 8 is configured to execute the command by issuing the appropriate signals to row control circuits 3 and column control circuits 2. When state machine 8 completes an operation, it returns a signal to command circuits 7, which in turn indicate to controller 20 that the operation is complete. Controller 20, memory array 1 and peripheral circuits may all be formed together on a single chip. Alternatively, the memory array and peripheral circuits are formed on one chip and the controller is formed on another chip as shown by the broken line dividing memory system 330 between controller chip 21 and memory array chip 22.

Memory array 1 is made up of erasable units of blocks. Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Figure 4:
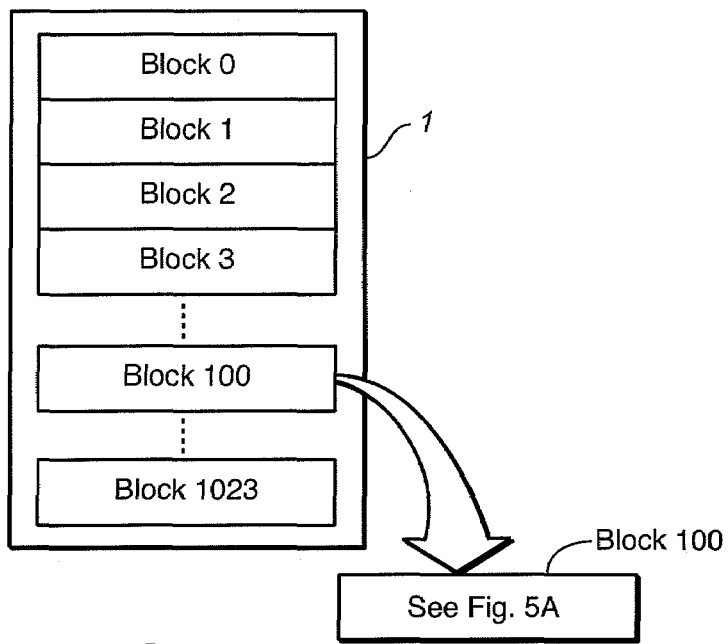
FIG. 4 illustrates the block structure of the memory array of the memory system of FIG. 3.

FIG. 4 shows the structure of memory array 1 comprising multiple blocks, a block being the minimum unit of erase. In this example, the memory array has 1024 blocks (blocks 0 to 1023), including block 100, which is described in more detail below. However, some memory arrays may have many more blocks. Blocks may also be linked to form metablocks that are erased together and so are treated as a single large block. In some memories, blocks may be arranged in planes, where a plane is a group of blocks that share certain read/write circuits.

Figure 5A:
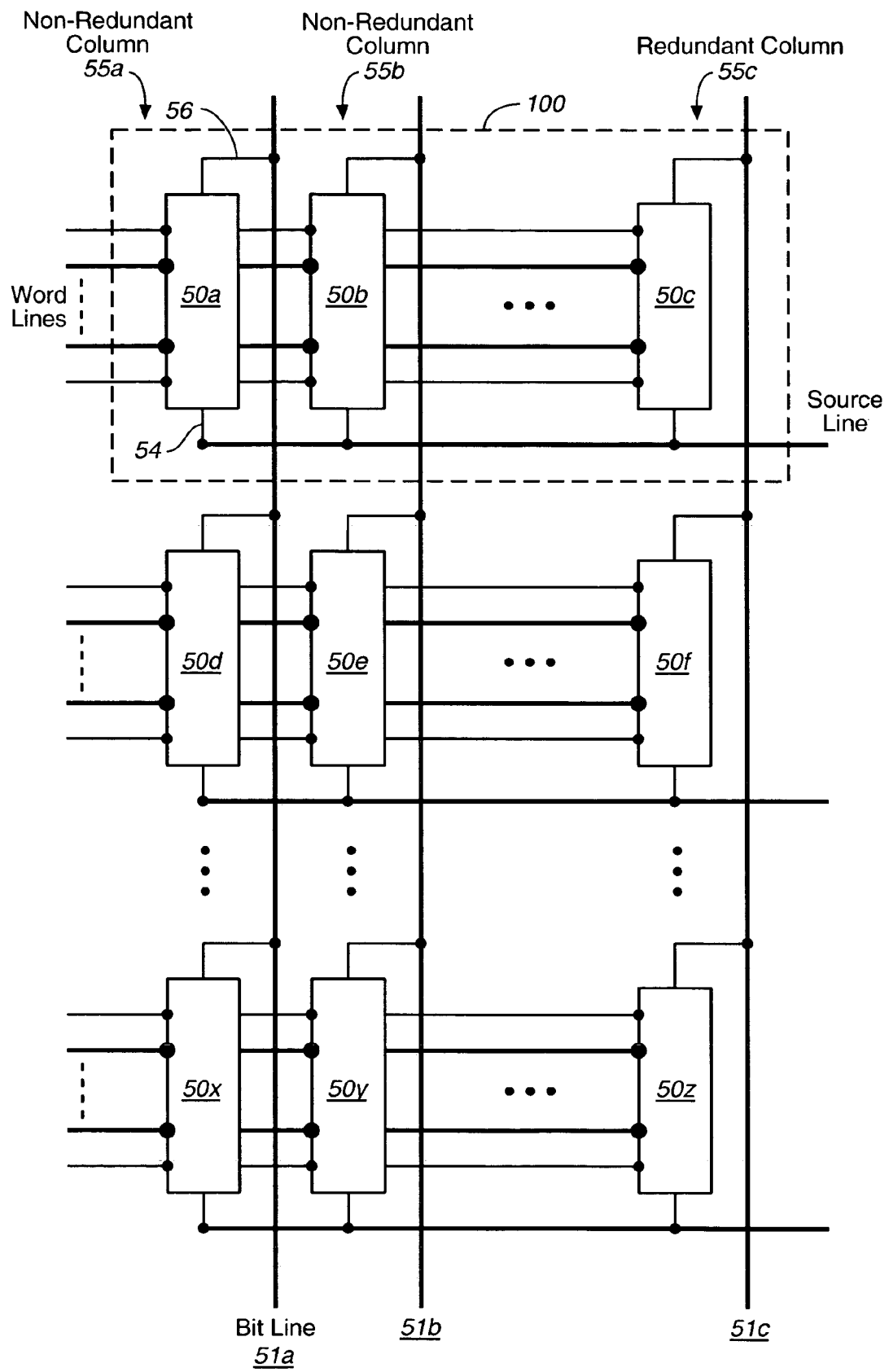
FIG. 5A shows the structure of a block 100 of FIG. 4 having multiple NAND strings connected by word lines and bit lines.
Figure 5B:
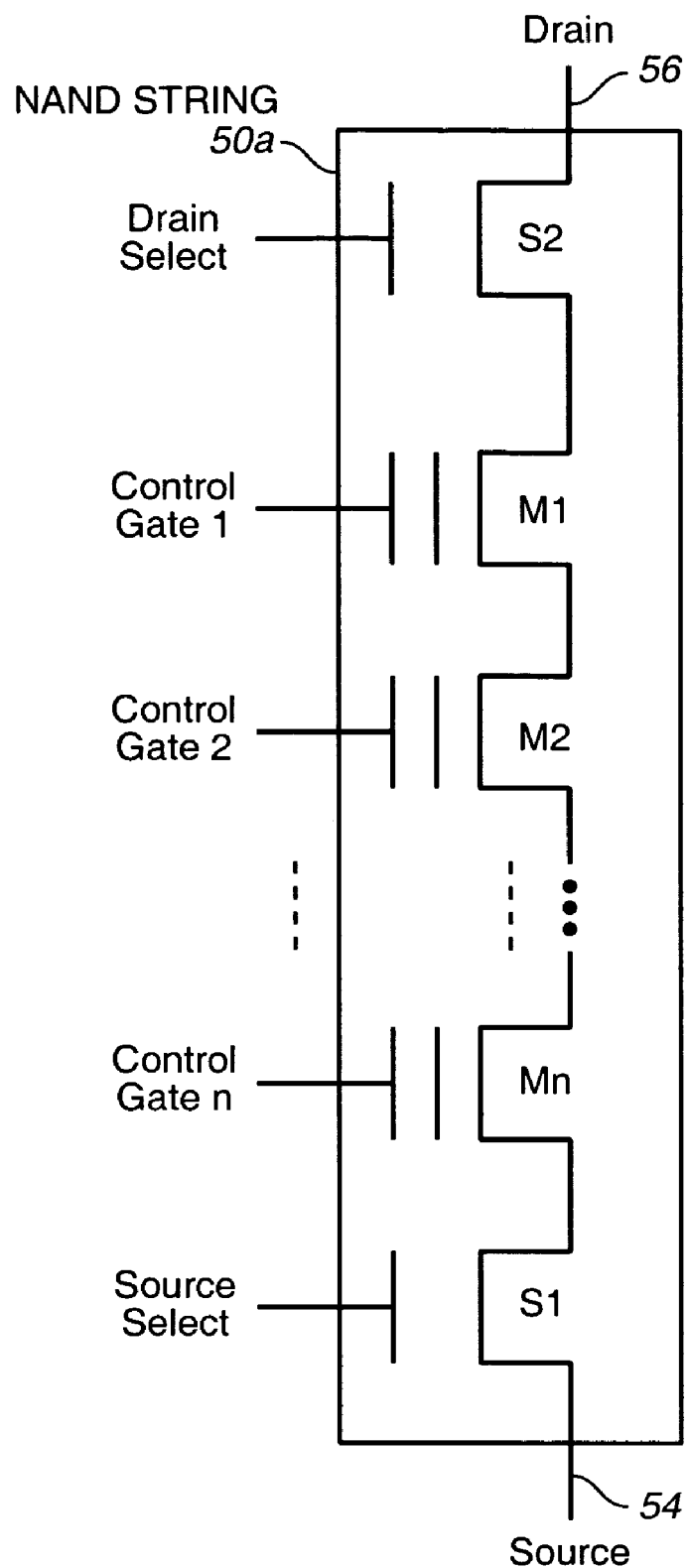
FIG. 5B shows a more detailed view of a NAND string of FIG. 5A.

FIGS. 5A and 5B show an example of the structure of the NAND memory array 1 that uses aspects of the present invention. Block 100 is comprised of multiple NAND strings 50a, 50b . . . 50c with each string having multiple floating gate cells in series. Additional strings that are not shown in FIG. 5A are located between string 50b and 50c. FIG. 5A shows how strings 50a, 50b . . . 50c are linked together to form a portion of an array (block 100). Bit lines 51a, 51b . . . 51c run vertically and have multiple strings connected to them. The NAND strings connected to a single bit line form a column. For example, strings 50a, 50d . . . 50x connected to bit line 51a form column 55a, strings 50b, 50e . . . 50y connected to bit line 51b form column 55b. Columns 55a and 55b are non-redundant columns. Strings 50c, 50f . . . 50z form redundant column 55c. A block, such as block 100, may extend across multiple columns as shown. Columns may extend in the vertical direction through multiple blocks. Redundant columns are columns that do not normally contain data unless there are defects. Non-redundant columns normally contain data when the portion of the memory where they are located is not erased. Data stored in a memory array may be host data, ECC data, some form of header data, control data stored by the controller or some other data. In the horizontal direction, word lines extend across the block. Source lines also extend across the block and connect to ends of the NAND strings. A set of cells connected by a word line may be considered a row of the memory array. Block 100 is made up of NAND strings 50a, 50b . . . 50c, connected by word lines. The cells of block 100 are erased together and are not separately erasable.

FIG. 5B illustrates schematically string 50a of memory cells organized into a NAND string. NAND string 50a consists of a series of memory transistors M1, M2, . . . Mn (n=4, 8, 16 or higher) daisy-chained by their sources and drains. A pair of select transistors S1, S2 controls the connection of string 50a to the remainder of the memory array via the NAND string's source terminal 54 and drain terminal 56. In a memory array, when the source select transistor S1 is turned on, the source terminal is coupled to a source line. Similarly, when the drain select transistor S2 is turned on, the drain terminal of the NAND string is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within a NAND string is read and verified during programming, its control gate is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the string. Block 100 extends across both redundant and non-redundant columns of the memory array. Defective cells within block 100 can be mapped to redundant cells that are also within block 100.

Figure 6:
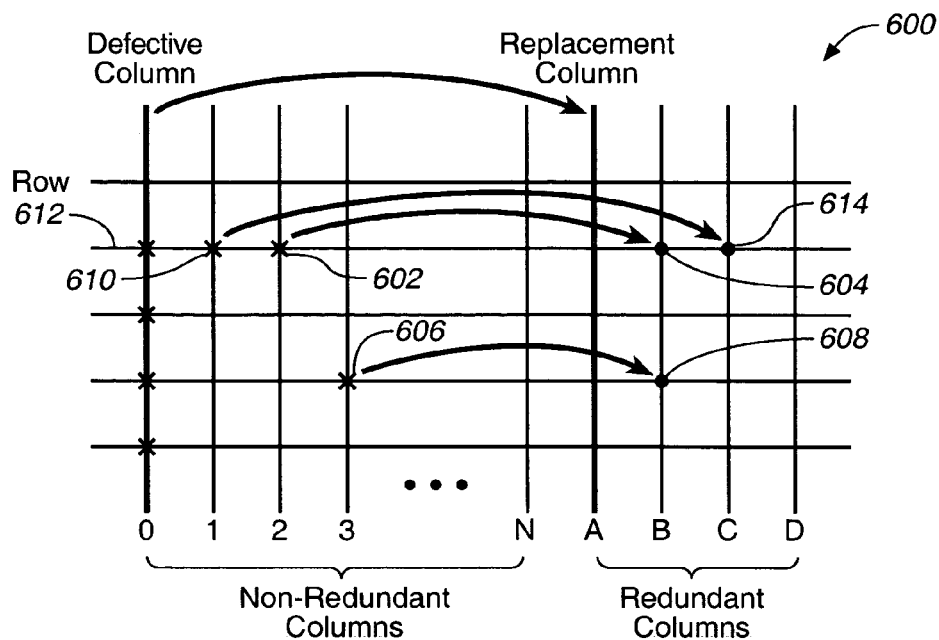
FIG. 6 shows an example of redundant cell and redundant column remapping according to an embodiment of the present invention.

FIG. 6 shows redundant column mapping according to an embodiment of the present invention. Unlike the prior art redundant columns, redundant column B of FIG. 6 contains data mapped from more than one non-redundant column (columns 2 and 3) of memory array 600. A first defective cell 602 in column 2 is mapped to a redundant cell 604 in redundant column B. A second defective cell 606 in column 3, is mapped to another redundant cell 608 in redundant column B. Thus, one redundant column (column B) is used for storing data from two different non-redundant columns (column 2 and column 3) in memory array 600. In this way, one redundant column can be used to repair multiple defects in the memory array. This is much more efficient than prior art schemes that used an entire redundant column for each defect in the memory array. In the embodiment shown, cells are mapped on a row-by-row basis, instead of mapping all the cells of a column when a defect is found in the column. Thus, only defective cells 602, 606 may be mapped to redundant column B. Other cells in columns 2 and 3 that are not defective are not mapped to redundant column B.

Defective cells are mapped to the cell in a redundant column that is in the same row. This means that the defective cell and the redundant cell that replaces it share a word line. In this scheme, only one defective cell along a word line can be mapped to a redundant column. However, where more than one redundant column is available, each defect along a row may be mapped to a different redundant column, so the number of tolerable defects in a row can be as many as the number of redundant columns available. For example, FIG. 6 shows a defective cell 610 in column 1. Defective cell 610 and defective cell 602 in column 2 are both in row 612. Because cell 604 in redundant column B is used for the data from cell 602, defective cell 610 is mapped to redundant cell 614 in redundant column C. The redundant column mapping scheme of FIG. 6 may be carried out in a memory array having a NAND structure such as that shown in FIGS. 5A and 5B or having a NOR structure or having another structure.

In addition to the redundant columns that have data mapped from multiple columns, there are additional redundant columns that operate in the conventional manner. These columns replace entire non-redundant columns so that every cell of the non-redundant column is replaced by a cell of the redundant column. This may be done when the non-redundant column is considered defective. This could be because all the cells in the column are defective (unreadable) or because more than a threshold number of cells in the column are defective. For example, FIG. 6 shows defective, non-redundant column 0 mapped to redundant column A, which becomes a replacement column.

Mapping defective cells to redundant cells (and mapping of defective columns to redundant columns) may either be done as part of an initial test and configuration operation or may be done at a later time after user data has already been stored in the memory system. In some examples, redundant columns are only used for remapping during the initial test and configuration operation that is typically performed at the factory before the memory system is sold or used. Defects that occur later, or are discovered later, may be dealt with in other ways. Remapping during initial test and configuration is permanent and so the remapping is recorded in an irreversible manner such as by using fuses.

While the relocation shown in FIG. 6 is either a single bit or an entire column, other units of replacement are also possible. For example, in NAND memories such as shown in FIGS. 5A and 5B, it may be convenient to replace a string of cells where the string contains a defective memory cell. Thus, for example, if string 50a of FIG. 5A includes a defective cell it may be replaced by string 50c without mapping other string such as string 50d that are connected to bit line 51a.

Figure 7:
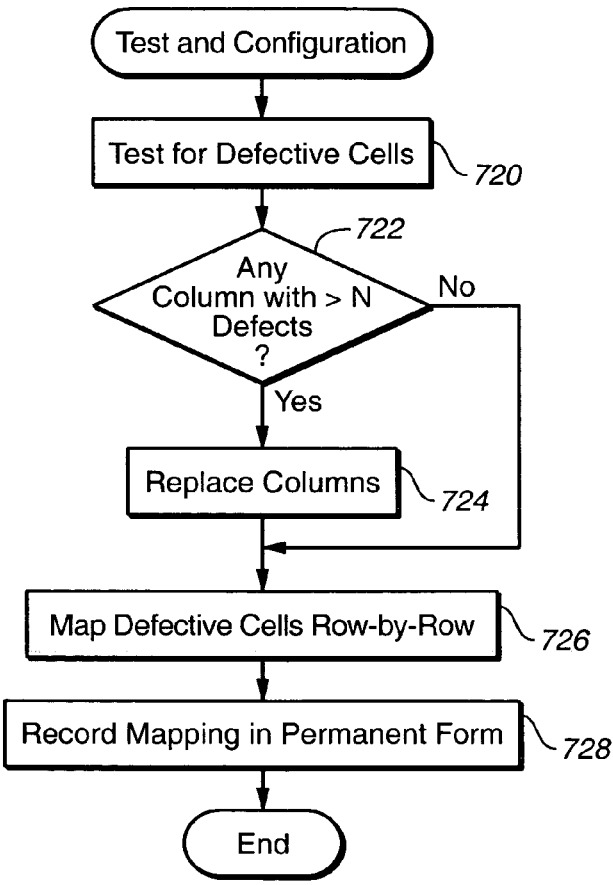
FIG. 7 shows a flowchart for a test and configuration operation to carry out a redundant cell and redundant column-remapping scheme such as that shown in FIG. 6.

FIG. 7 shows a flowchart of an initial test and configuration operation on a memory array according to an embodiment of the present invention. This test and configuration shown may be carried out using test equipment that is connected to the memory array after it is manufactured but before it is used with a host. The memory array is generally tested in isolation from the controller and other circuits. Card level testing may also be performed but generally does not indicate defects in the memory array. First, a test is done to determine if there are defective cells in the memory array 720. This may be done by programming test data to the memory array and then reading it back. If data cannot be programmed within a predetermined time, then a cell may be considered to be defective. If the data read back from a cell is not the same as that written to it, the cell may be considered defective. If a cell does not reach the erased state within a predetermined time during an erase operation, the cell may also be considered defective. Alternatively, leakage current may be measured to identify defective cells, or some other means of identifying defective cells may be used. The entire memory array may be tested for defective cells to determine the locations of all defective cells in the memory array. Next, it is determined if any column of the memory array has more than a threshold number of defective cells 722. If a column has more than the threshold number of defective cells, then the entire column is replaced by a redundant column 724. This is similar to the column replacement of the prior art. In one example, the threshold number is equal to the number of cells in the column. In this case, an entire column is replaced only if all cells in the column are defective. If fewer than all cells in the column are defective, then they are individually replaced. After mapping defective columns, individual defective cells are mapped to redundant cells in one or more defective columns 726. One redundant column may contain data mapped from multiple non-redundant columns in this way. The mapping of defective cells to redundant cells is recorded in a permanent manner 728 so that the information remains with the memory array for future use. One way to permanently record such defect mapping data is to use fuses or antifuses indicating the locations of the defective memory cells and their replacements. Another way to permanently record the defect mapping data is to store it in a portion of the nonvolatile memory that is dedicated to storage of such data and is configured so that it is not later erased. This may be done through hardware or software. Other methods of permanently storing defect mapping data may also be used.

Figure 8:
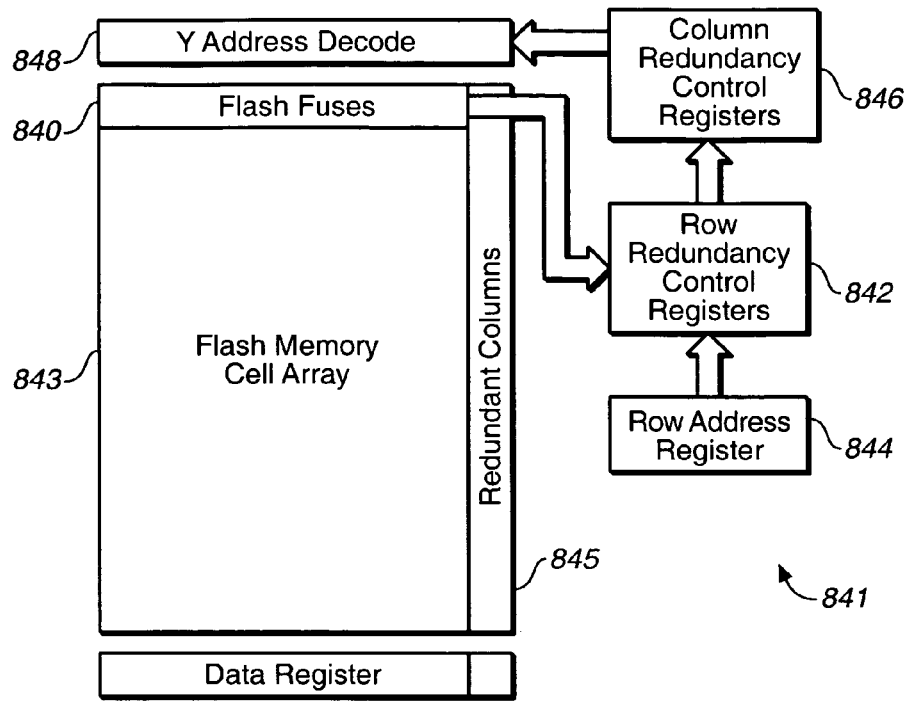
FIG. 8 shows a block diagram of circuitry used to carry out a redundant cell and redundant column-remapping scheme such as that of FIG. 6.

FIG. 8 shows an example of a memory system 841, including flash memory cell array 843, that includes aspects of the present invention. Flash fuses 840 are present as in certain prior art systems (laser fuses or some equivalent structure may also be used). The defect mapping data stored in flash fuses 840 is first loaded into row redundancy control registers 842. Row redundancy control registers 842 have an input from a row address register 844. This input allows the row address of the next row that is to be read to be transferred to row redundancy control registers 842. The row address is compared with the row addresses in the row redundancy control registers 842 (loaded from flash fuses) to determine if there are any defects in the row. If the row address is not the same as a row address in row redundancy control register 842, then there is no defective cell in the addressed row and the row may be accessed using the default column addresses without accessing redundant columns 845. If the row address from row address register 844 matches a row address in row redundancy control registers 842, then this is signaled to column redundancy control registers 846 which determines the redundant column to be accessed instead of the non-redundant column that contains the defect in the addressed row. The column addresses provided to Y-address decode circuits 848 for this row indicate the redundant column and not the non-redundant column that contains the defective cell. Thus, redundant columns are accessed on a row-by-row basis, whereas in the prior art, access was independent of the row address. Here, both row and column addresses must match a recorded defect location, where in the prior art only a column address match was needed. This row-by-row mapping scheme may be done as the only replacement scheme or may be done in conjunction with a column replacement scheme as shown in FIG. 6. These schemes may also be combined with other schemes for replacing portions of the memory array, such as replacement of entire blocks where the number of defective cells or defective columns is more than a predetermined number.

The hardware needed to carry out the replacement scheme described may be included in peripheral circuits that are formed on the same chip as the memory array. Examples of hardware used to carry out column redundancy schemes are provided in U.S. Pat. No. 6,560,146 and U.S. patent Publication No. 2005/0141387A1, entitled "Flexible and area efficient column redundancy for flash memories," which are hereby incorporated by reference in their entirety. The circuits shown in patent application Publication No. 2005/0141387A1 may be adapted to carry out a retargetable memory cell redundancy scheme such as that of memory system 841 by adding circuitry that receives a row address and compares the row address to stored addresses of rows having cells that are remapped.

Figure 9:
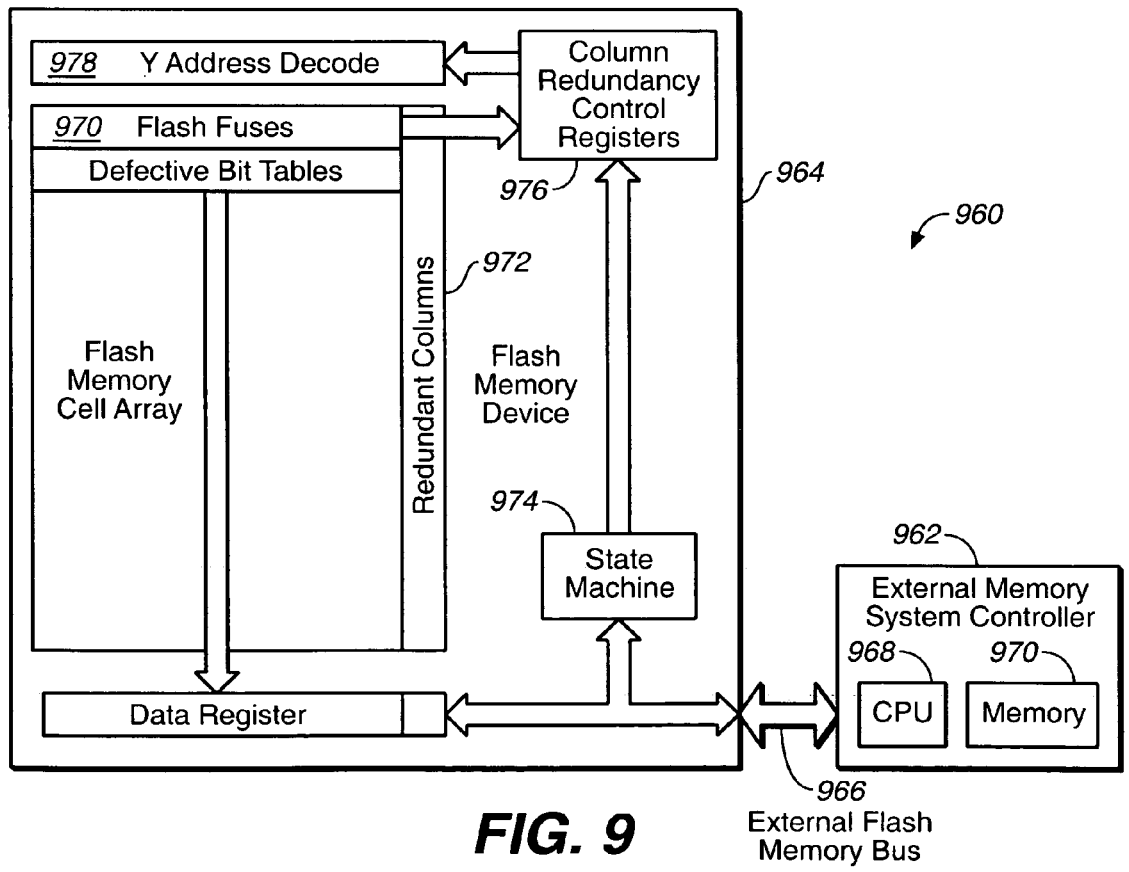
FIG. 9 shows a block diagram of an alternative hardware used to carry out a redundant cell and redundant column remapping scheme such as that of FIG. 6.

FIG. 9 shows another example of a memory system 960 according to the present invention. An external memory system controller 962 is shown connected to a flash memory device 964. This is similar to the example shown in FIG. 3. Here, external memory system controller 962 is connected to flash memory device 964 by an external flash memory bus 966. Typically, external memory system controller 962 and flash memory device 964 are formed on separate chips. External memory system controller 962 includes a Central Processing Unit (CPU) or microprocessor 968 and a controller memory 970, which may be a Random Access Memory (RAM). Defect mapping data may be loaded into controller memory 970 when external memory system controller 962 is turned on. Alternatively, a nonvolatile RAM may be used to keep the defect mapping data. In memory system 960, controller memory 970 is loaded with the defect mapping data from flash fuses 970. Alternatively, the defect mapping data may be stored in any other suitable location. External memory system controller 962 compares the locations of defects with the physical addresses of the data that is being accessed. When a match occurs between both the row and column addresses of data being accessed and a defect location, external memory system controller 962 sends an access command to flash memory device 964 indicating one of redundant columns 972 instead of the column with the defective cell. State machine 974 then causes column redundancy control registers 976 to indicate the redundant column to Y-address decode circuits 978 in place of the column with the defective cell. Thus, the functions carried out by the dedicated hardware in memory system 841 of FIG. 8 are carried out by external memory system controller 962 in FIG. 9. This example has the advantage that it is easier to implement because it does not require hardware changes as an external memory system controller is already provided in most memory systems to manage the memory system. However, this method may be slower and places additional burdens on external memory system controller 962 and on external flash memory bus 966 which may cause memory system 960 to run slower than if these functions are carried out by dedicated circuitry on the memory array chip.

In the schemes described above, a bit (or bits) of data for a defective cell is relocated to a redundant cell that is in the same row (connected to the same word line). In many memory designs, a block extends along one or more word lines. Thus, the cells of a row, or of a group of rows are erased together. In an embodiment of the present invention, a block extends to include non-redundant and redundant cells connected by a word line. Any defective cells in the block are remapped to redundant cells within the same block. Thus, when the non-redundant cells are erased, the data that was remapped from the non-redundant cells to redundant cells in redundant columns is also erased. This means that no separate data management structures are required for tracking when data in redundant cells becomes obsolete. Because both non-redundant and redundant cells are erased together, they are both returned to the erased state and are ready to receive new data without any separate operation.

Although various aspects of the present invention have been described with respect to particular embodiments, it will be understood that the invention is entitled to protection within the full scope of the appended claims.

The invention claimed is:

1. A nonvolatile memory array, comprising:
a first column of memory cells that contains a defective cell and nondefective cells;
a second column of memory cells that is a redundant column that contains only data relocated from outside the second column of memory cells; and
the defective cell individually mapped to a redundant cell in the second column such that data to be stored in the defective cell is stored in the redundant cell, the defective cell and the redundant cell in the same row, the second column containing no data mapped from the nondefective cells of the first column.

2. The memory array of claim 1 further comprising a third column that is considered defective and does not store data, all data for the third column stored in a fourth column that is a redundant column.

3. The memory array of claim 2 wherein the third column is considered defective because it has a number of defective cells that exceeds a threshold number that is greater than one, and that is less than the number of cells in the third column.

4. The memory array of claim 1 wherein the defective cell and the redundant cell are in the same block and are not separately erasable.

5. The memory array of claim 4 wherein the mapping of the defective cell to the redundant cell is recorded in another block of the memory array.

6. The memory array of claim 1 wherein the second column contains additional data that is mapped from defective cells in columns other than the first column.

7. The memory array of claim 1 wherein the mapping of the defective cell to the redundant cell is recorded outside the nonvolatile memory array.

8. The memory array of claim 1 wherein the mapping of the defective cell to the redundant cell is permanently recorded using a fuse or antifuse.

9. The memory array of claim 1 wherein the memory array has a NAND structure.

10. The memory array of claim 1 wherein an individual cell of the first or second column contains two or more bits of data.

11. The memory array of claim 1 wherein, subsequently, when access to the defective cell is attempted, the redundant cell is accessed instead.

12. The memory array of claim 11 wherein, when access to the defective cell is attempted, both the row and column of the defective cell are compared to a defect map to determine that the defective cell is defective.

13. The memory array of claim 12 wherein the row and column are compared to the defect map by a dedicated state machine connected to the memory array.

14. The memory array of claim 12 wherein the row and column are compared to the defect map by a controller that also performs other memory management functions.

15. A nonvolatile NAND flash memory array, comprising:
a first column of NAND strings that contains a defective string and nondefective strings;
a second column of NAND strings that is a redundant column that contains only data relocated from outside the second column of NAND strings;
the defective NAND string individually mapped to a redundant NAND string in the second column such that data to be stored in the defective NAND string is stored in the redundant NAND string, the second column containing no data mapped from the nondefective NAND strings of the first column;
a third column that is considered defective because it has a number of defective strings that exceeds a threshold number; and
The entire third column mapped to a redundant fourth column to replace the third column.

16. The nonvolatile NAND flash memory array of claim 15 wherein the defective string and the redundant NAND string are in a common block.

* * * * *